(12) United States Patent
Robinson et al.

(10) Patent No.: US 6,180,944 B1
(45) Date of Patent: Jan. 30, 2001

(54) LARGE AREA X-RAY IMAGER WITH VENTED SEAM AND METHOD OF FABRICATION

(75) Inventors: George D. Robinson, Sewell, NJ (US); Lothar S. Jeromin, Newark, DE (US)

(73) Assignee: Direct Radiography, Corp., Newark, DE (US)

( * ) Notice: Under 35 U.S.C. 154(b), the term of this patent shall be extended for 0 days.

(21) Appl. No.: 09/111,052

(22) Filed: Jul. 7, 1998

(51) Int. Cl.$^7$ .................................................. H01L 25/065
(52) U.S. Cl. ...................... 250/370.09; 438/80; 438/107
(58) Field of Search .......................... 250/370.09, 580; 438/67, 80, 107; 156/87, 304.5

(56) References Cited

U.S. PATENT DOCUMENTS

| | | |
|---|---|---|
| 4,843,035 | 6/1989 | Takashima . |
| 5,105,087 | 4/1992 | Jagielinski . |
| 5,254,480 | 10/1993 | Tran . |
| 5,315,101 | 5/1994 | Hughes et al. . |
| 5,319,206 | 6/1994 | Lee et al. . |
| 5,369,281 | 11/1994 | Spinnler et al. . |
| 5,381,014 | 1/1995 | Jeromin et al. . |
| 5,391,236 | 2/1995 | Krut et al. . |

*Primary Examiner*—Constantine Hannaher
(74) *Attorney, Agent, or Firm*—Ratner & Prestia

(57) ABSTRACT

A method for forming a large imaging panel by assembling a plurality of smaller submodules, the method comprising providing an adhesive filler between two abutting edges of a first and a second submodule, and forming a degassing channel in the adhesive filler extending along the length of the abutting edges. The method may further comprise adhering the submodules onto a top surface of a base plate, beveling the abutting edges of the submodules, and forming the degassing channel in the space between the beveled edges and the base plate. The method may produce an X-ray image capture panel comprising a base plate; a plurality of discrete array submodules juxtaposed over the base plate, each adjacent to at least one other submodule to form a two-dimensional mosaic of submodules having seams therebetween, each seam being filled with filler material and a vented channel in the seam adjacent to the top surface of the base plate; and a continuous radiation detecting layer disposed over the plurality of array submodules.

19 Claims, 4 Drawing Sheets

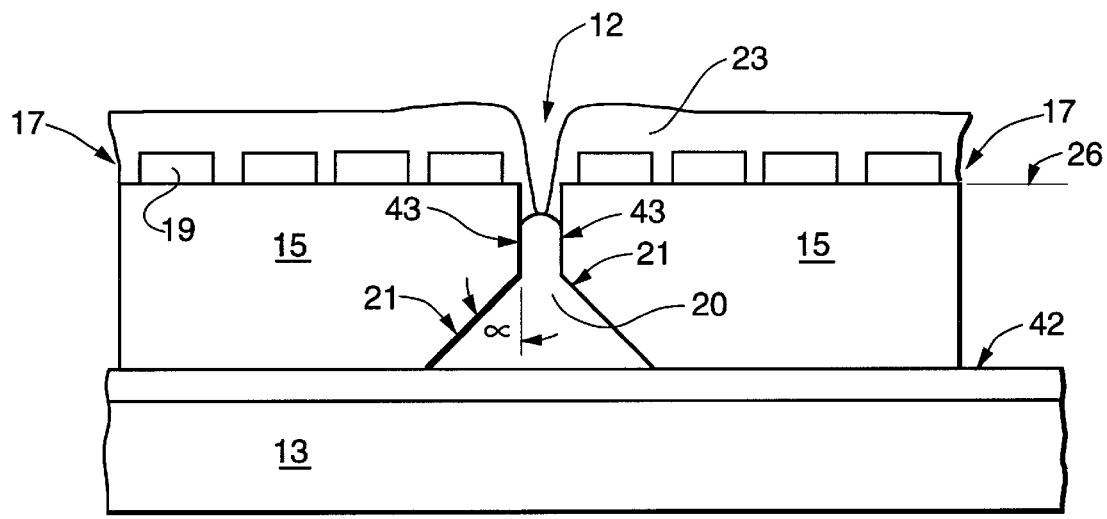
PRIOR ART  Fig. 2
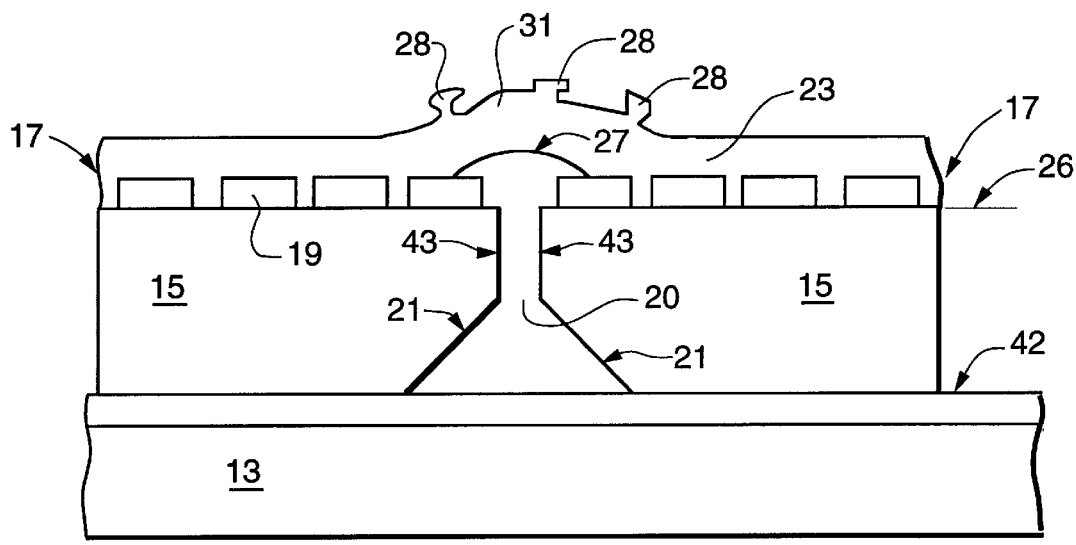
PRIOR ART  Fig. 3

LARGE AREA X-RAY IMAGER WITH VENTED SEAM AND METHOD OF FABRICATION

TECHNICAL FIELD

This invention relates to a method for tiling together adjacent discrete array submodules such as thin film transistor panels, and the resulting large panel, and more particularly to a method for tiling together a plurality of TFT submodules on which there is subsequently deposited an imaging layer.

BACKGROUND OF THE INVENTION

The development of large scale image capture and image display devices such as radiographic imaging panels and liquid crystal display devices requires large scale arrays of radiation detection sensors in the first instance and similarly large scale arrays of imaging pixels in the second.

Both the radiation detection sensors and the imaging pixels comprise complex electronic structures which include electronic switching devices in addition to means to either capture an electronic charge representing incident radiation, or means to alter the state of a liquid crystal material to display a visible image.

Radiation detection panels, particularly panels intended for medical radiography applications must be at least 14"×17" to be commercially useful. Similarly, liquid crystal displays must be of the order of at least 8"×10" for a laptop personal computer application, and substantially larger for television displays.

Each of those panels comprises a number of individual detectors or display pixels which is in the millions. For instance a 14"×17" diagnostic quality radiation detection panel will have approximately eight million detectors arrayed in regularly spaced lines and columns, with multiple conductors running in the interstitial spaces between detectors for accessing the detectors and retrieving the signals representing the radiogram. Each detector comprises at least one switching element, usually a Thin Film Transistor, coupled with the actual radiation detector. Even with the currently high quality manufacturing abilities available, yields of commercially useful panels with so many elements are relatively low, and as a result, the cost of such large size panels is high.

The yield rate is related to the overall number of elements in a panel, and rises with the square of the panel size. It is therefore often advantageous to assemble into larger panels of the desired size a plurality of smaller panels which may be produced at higher yields at substantially lower cost. This process of making larger panels from a plurality of smaller panels is typically referred to in the art as "tiling". U.S. Pat. No. 5,381,014 issued to Jeromin et al., whose contents are incorporated herein by reference, as well as U.S. Pat. No. 5,254,480 issued to Tran, and U.S. Pat. No. 5,315,101 issued to Hughes et al., describe such tiling process.

The process for assembling the smaller panels or submodules, into a larger panel, typically involves adjoining two or four submodules by placing an adhesive along the adjoining edges and adhering the submodules to each other. The aforementioned Jeromin et al patent teaches placing the submodules to be joined on a supporting dielectric base and adhering the submodules both to each other and to the supporting base. Still according to the teachings of Jeromin et al., the abutting submodule edges are ground to a high degree of precision and contain a beveled portion in the vicinity of the supporting base.

Typically, after joining the submodules, completion of an imaging panel entails depositing a continuous radiation detecting material layer such as selenium, or a continuous image display layer, over the assembled submodules to provide a means to detect incident radiation or to display an image.

While this technique has provided generally good results, it has been observed that the larger panel response to in the vicinity of the submodule juncture is deficient. The deficiency has been tracked, among other reasons, to the formation of bubbles in the imaging layer above the junction between the panels. We will refer to this junction hereinafter as the "seam". These bubbles were attributed to gas being released from the adhesive in the seam, typically an epoxy, during deposition of the imaging layer.

There is need therefore, to provide a method of alleviating this gassing problem in the seams between adjacent submodules.

SUMMARY OF THE INVENTION

In accordance with this invention, there is provided a method for forming a large imaging panel by assembling a plurality of smaller submodules, the method comprising providing an adhesive filler between two abutting edges of a first and a second submodule, and forming a degassing channel in the adhesive filler extending along the length of the abutting edges.

The method may further comprise forming the large detection panel by adhering the smaller radiation detection submodules onto a top surface of a base plate, beveling at least a portion of the abutting edges of the submodules, and forming the degassing channel in the space between the beveled edges of the abutting panels and the top surface of the supporting plate.

Still according to the present invention there is provided an X-ray image capture panel comprising:

a base plate having a top surface;

a plurality of discrete array submodules juxtaposed over the top surface of the base plate such that each submodule is disposed adjacent to at least one other submodule to form a two-dimensional mosaic of submodules having seams therebetween, each of said submodules including a dielectric substrate having a top surface and a bottom surface disposed adjacent the top surface of said base plate, and a plurality of transistors arrayed adjacent the top surface of said dielectric substrate, and each of said seams being filled with filler material and a vented channel in the seam adjacent to the top surface of said base plate; and a continuous radiation detecting layer disposed over the plurality of array submodules, said radiation detecting layer for producing electrical charges representative of a pattern of incident x-ray radiation.

BRIEF DESCRIPTION OF DRAWINGS

FIG. 2 is schematic representation of a cross sectional view of the panel of FIG. 1 prepared according to the prior art, taken along arrows 2—2

FIG. 3 is schematic representation of a cross sectional view of panel of FIG. 1 prepared according to an alternate method of the prior art.

Figure 1:
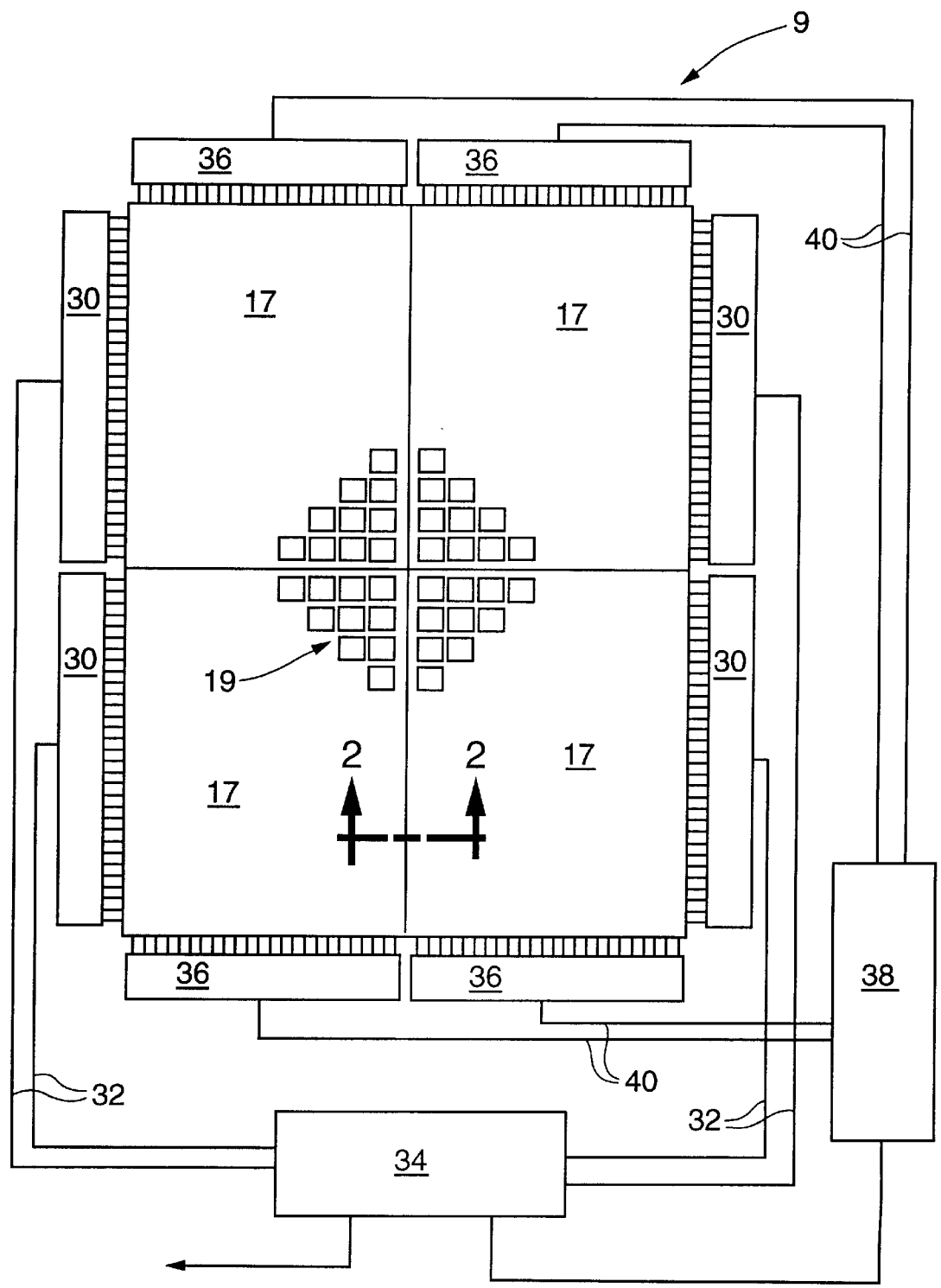
FIG. 1 is schematic top view of a large radiation detection panel formed by tiling a plurality of smaller size submodules.
Figure 5:
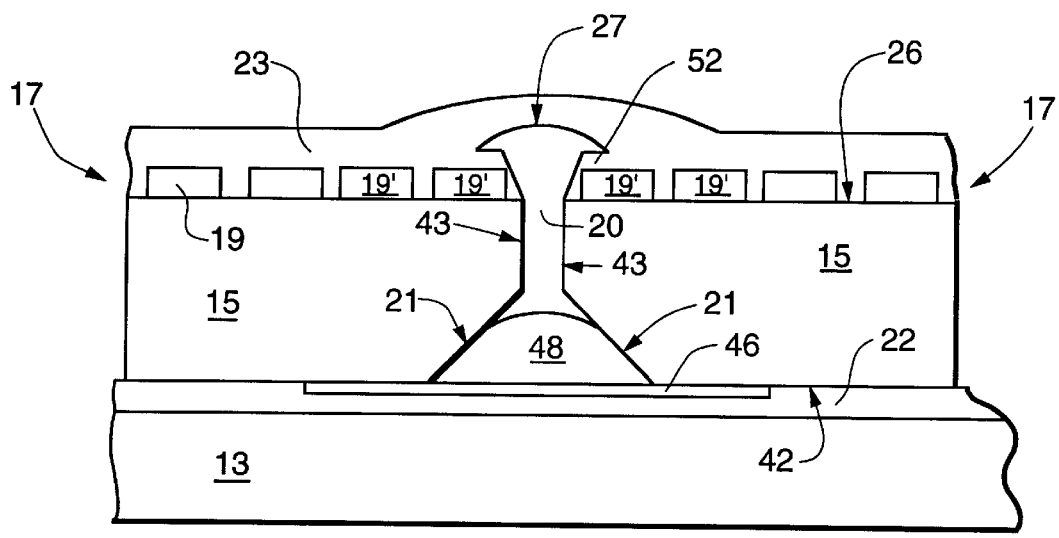

FIG. 5 is a schematic representation of a cross sectional view of he seam of a completed large panel of the type shown in FIG. 1 prepared according to the present invention.

Figure 6:
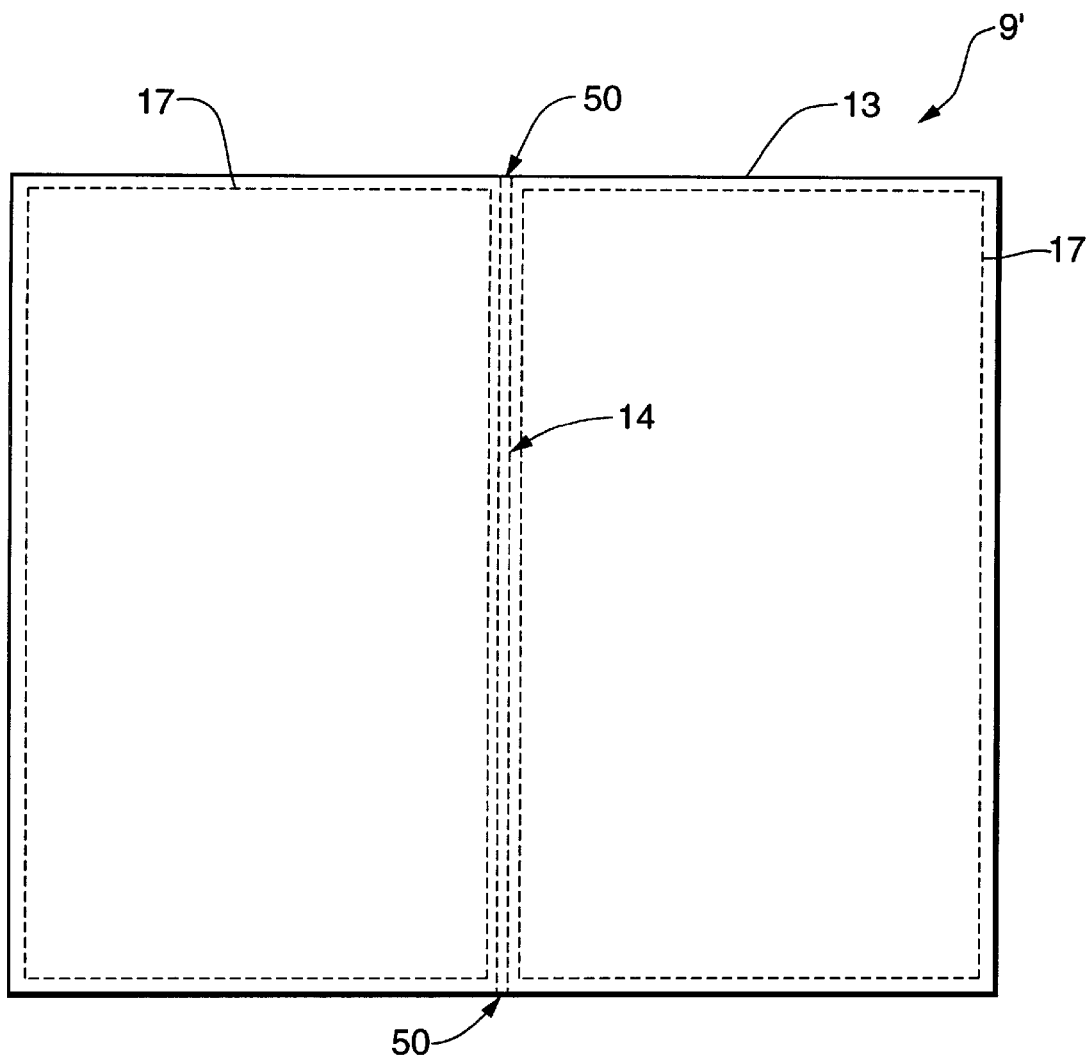

FIG. 6 is a schematic top view a large panel comprising two smaller submodules joined by the process of the present invention.

DETAILED DESCRIPTION OF INVENTION

The invention will next be illustrated with reference to the figures wherein similar numbers indicate the same panels or materials in all figures. Such figures are intended to be illustrative rather than limiting and are included herewith to facilitate the explanation of the apparatus of the present invention. The invention will also be illustrated using a radiation detection panel which employs the type of sensor disclosed in U.S. Pat. No. 5,319,206 issued Jun. 7, 1994 to Lee et al. and presently assigned to the assignee of this invention. Other sensor types and fewer or more submodules can be used to form the large size panel in accordance with this invention.

While this invention will be described with reference to a radiation detection panel, it is understood that it is equally applicable to large scale image display panels wherein instead of a radiation detection layer, an image display layer is used, such as an electroluminescent phosphor layer or a liquid crystal layer. Thus in general this invention is applicable to all tiling situation wherein smaller submodules are assembled to form a larger imaging panel wherein a continuous imaging layer is applied over the assembled submodules.

Referring now to FIG. 1, there is shown a large size image capture panel 9 capable of convening a pattern of imagewise modulated radiation into a plurality of electrical charges representative of the imagewise modulated radiation. Four submodules 17, which detect electrical charges, are shown contiguously positioned together to form the larger image capture panel 9. Each of such submodules contains an array of transistor-capacitor sensors 19, a limited number of which are illustrated to prevent clutter of the figure.

Typically an electronic addressing chip 30 is provided for each submodule 17, and this chip addresses each of the individual sensors 19 and is electrically connected over lines 32 to a central control unit 34. The control unit 34 enables sequential electronic access to the gates of the sensors 19 and thus simultaneous electronic access to the array submodules 17. Electronic charge measuring chips 36 are connected to the sensors 19 and also to a multiplexing submodule 38 over lines 40. The multiplexing submodule 38 is also connected to the central control unit 34 which provides control signals to the sensors 19 and receives electronic signals indicative of the strength of an incident imagewise-modulated X-ray pattern from each of the sensors.

Referring next to FIG. 2, there is shown a schematic representation of an elevation view of the seam between two submodules taken along arrows 2—2 in FIG. 1 in the image capture panel 9 of the prior art. In accordance with the prior art, adjoining array submodules 17 are contiguously positioned onto a base plate 13 to form the image capture panel 9. Each array submodule 17 further comprises a dielectric substrate 15 and a plurality of transistor-capacitor sensors 19 that detect electrical charges. The array submodules 17 are positioned such that a butt joint seam 12 is provided between adjacent edges of the two juxtaposed array submodules 17.

The dielectric substrates 15 are joined according to the prior art as follows. The edges of each substrate 15 are ground to a 90° ±4 seconds angle perpendicular to the top surface. Each seam edge face is beveled at an angle α to vertical on the bottom of each substrate 15 where the substrates 15 butt together, thus reducing the surface area of contact between substrates 15. The angle α is typically 10°, but can be as large as 45°. Preferably, the beveled section extends about ¾ of the distance up from the lower surface 42 to the upper surface 26. The gap formed between beveled edges 21 when substrates 15 are butted together, is filled with an adhesive filler 20 such as an epoxy to a level just below the dielectric surface 26 of the submodules. Base plate 13 is adhered to the backside surface 42 of the submodules with the same adhesive 20.

Following assembly of the submodules a radiation detection layer 23, such as Selenium, is deposited over the assembled submodules to form the radiation detection sensors. Depending on the particular sensor structure, the radiation detection layer may comprise a plurality of layers over and under the actual radiation sensitive layer.

For example in a preferred structure of a radiological detection panel, there is an insulating layer placed over the assembled submodules under the radiation detection layer, and a second charge blocking layer placed over the radiation detection layer. A final conductive electrode layer is also deposited over the top insulating layer. To avoid unnecessary clutter all these various additional layers are not illustrated individually but are understood to be included in the radiation detection layer.

As shown in FIG. 2, the radiation detection layer in the vicinity of the seam forms a crevice 12 which is preceded by two slight ridges on either side of the crevice. This results in non uniform radiation detection in the vicinity of the seam.

The prior art has attempted to remedy this problem by overfilling the seam with the adhesive as shown in FIG. 3. In FIG. 3 the adhesive 20 is applied in sufficient quantity to flow over the upper surface 26 of the submodules producing a ridge 27. As a result, following the deposition of the radiation detection layer 23, the crevice 12 shown in FIG. 2 is replaced by a ridge 31. It has been observed that a ridge in the radiation detection layer is less of a problem than a crevice.

Unfortunately, while the crevice was found to have been eliminated, it was also found that in the vicinity of the seam the surface of the ridge 31 contained a plurality of bubbles 28, that is raised areas of the layer, which are undesirable as they result in image defects.

Figure 4:
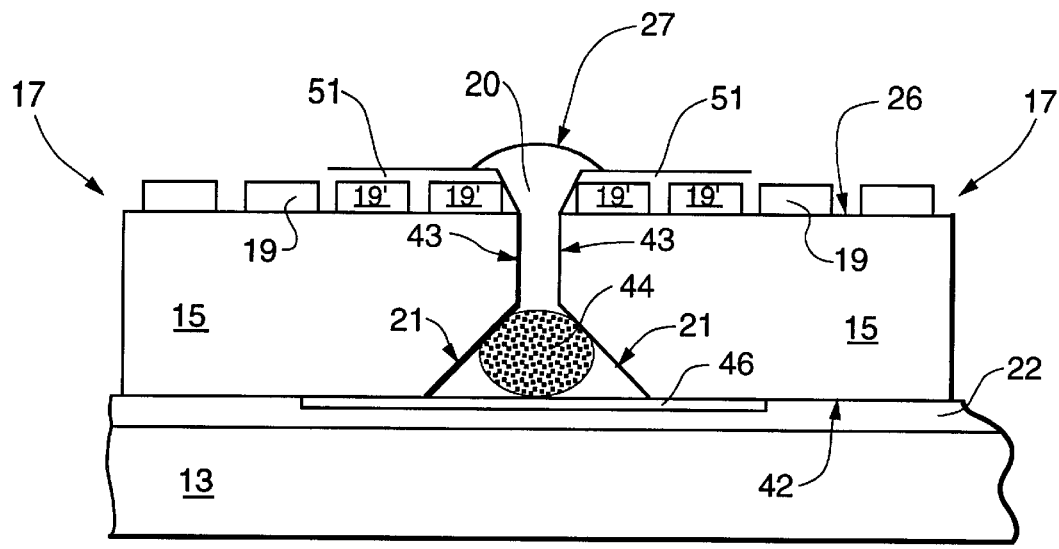
FIG. 4 is a schematic representation of a cross sectional view of the seam a large panel of the type shown in FIG. 1 prepared according to the present invention but prior to the application of the radiation detection layer.

The present invention eliminates those defects by a process illustrated in FIGS. 4, 5 and 6 involving the following steps.

The submodules 17 are again produced as before and prepared for assembly by cutting and beveling of the adjoining surfaces as previously. Next, with each submodule upper surface 26 facing up, a precision bead of filler 20 is placed on one unbeveled portion 43. The filler material is preferably a five-minute epoxy such as HYSOL® 608. Next, the submodules are pressed together until filler 20 extrudes onto both upper surfaces 26, producing joined submodules. To impart the necessary precision to this step, typically the submodule without the filler bead is placed on a vacuum table and held down by vacuum. While observing with a video camera and monitor or through a microscope, the operator performing the joining operation lays the submodule with the filler bead on a vacuum table with its edge face parallel to the submodule held by vacuum. The submodule with the filler bead is then slowly pushed into the first panel until the filler material extrudes above upper surface 26 of both submodules 17, resulting in ridge 27. The quantity of filler 20 in the precision bead is limited such that combination of the limited amount of filler and surface tension prevents the filler from flowing completely down the seam.

The joined submodules are then turned over so that the lower surfaces 42 are facing up, revealing the gap between submodules 17 and the beveled portions 21. A cord 44 is now inserted in the gap. Preferably, the cord is a 0.005" diameter nylon cord. Typically, the cord is greased with vacuum grease for easy removal, and is inserted in the gap along the entire length of the seam adjacent to substrates 15, with approximately four inches extending out each end 50.

Next, a strip of film 46 is adhered across the gap to cover it. Preferably, the film is a strip of clear polyester 0.25 inches wide by 0.002 inches thick with silicone adhesive, such as Permacel® tape.

Next, adhesive 22 is applied across lower surface 42 of the joined submodules and across film 46. Preferably, the adhesive is UV-curable optical adhesive such as Norland Optical Adhesive "NOA 61" manufactured by Norland Products, Inc. Then, base plate 13 is placed on adhesive 22, thus bonding it to joined submodules 17. After adhesive 22 is completely cured, cord 44 is pulled out from one end 50 of the seam, thus leaving a vent channel 48 for gases to escape out either end 50 of the seam.

Typically, because excessive handling of the submodules can cause damage to the transistors, a microfilm of novolac resin 51 such as that sold by OCG Microelectronic Materials, Inc., is spin coated onto each submodule prior to any handling during the joining or beveling steps above. The coating is chemically spin-stripped off before the next steps in the manufacture of the x-ray capture panel. Because the novolac microfilm is so thin, it can be removed from between ridge 27 of extruded filler 20 and the submodule upper surface 26, leaving a microthin gap 52. The microfilm coating protects sensors 19' from being coated with filler as well as protecting all sensors 19 from handling damage during the joining operation.

After removal of the novolac microfilm, the radiation detection layer 23 is applied by any of the various methods known in the art. Typically, when the radiation detection layer comprises an inorganic photoconductor such as Selenium, the preferred deposition method for the photoconductor is vacuum deposition. The completed seam of the present invention eliminates a crevice in layer 23 at the seam by filling the seam completely with filler 20. It eliminates bubbles in layer 23 by routing any gases released during application of layer 23 via vent 48 instead of through layer 23.

The resulting X-ray image capture panel 9 comprises a base plate 13, a plurality of discrete array submodules 17 juxtaposed over the top surface of base plate 13 such that each submodule 17 is disposed adjacent to at least one other submodule 17 to form a two-dimensional mosaic of submodules 17 having seams 14 thereinbetween. Each submodule 17 comprises a dielectric substrate 15 having a top surface and a bottom or backside surface disposed adjacent the top surface of base plate 13, and a plurality of sensors 19 arrayed adjacent the top surface of substrate 15. Each seam is filled with filler material 20 that forms ridge 27 above the submodule upper surface 26 but does not extend to the substrate bottom surface 42, thus leaving vented channel 48 in the seam adjacent to the top surface of base plate 13. Continuous radiation detecting layer 23 is disposed over the plurality of array submodules 17. In a preferred embodiment, wherein the radiation detector sensors are of the type described in the aforementioned U.S. Pat. No. 5,381,014, the radiation detecting layer is capable of producing electrical charges representative of a pattern of incident x-ray radiation.

Those skilled in the art having the benefit of the teachings of the present invention as hereinabove set forth, can effect numerous modifications thereto. These modifications are to be construed as being encompassed within the scope of the present invention as set forth in the appended claims.

What is claimed is:

1. A method for forming a large imaging panel by assembling smaller imaging submodules the method comprising providing an adhesive substance between two abutting edges of a first and a second submodule said edges having a length, the improvement comprising forming a degassing channel in said adhesive, said channel extending along the length of said edges.

2. The method according to claim 1 wherein the imaging panel is a radiation detection panel formed by assembling smaller radiation detection submodules.

3. The method according to claim 2 further comprising forming the large radiation detection panel by adhering said smaller radiation detection submodules onto a top surface of a base plate, beveling at least a portion of said abutting edges and wherein the adhesive provided between two abutting edges extends in the space defined between said beveled edges and the degassing channel is formed in a portion of the adhesive filling the space defined between said beveled edges of said abutting submodules and the top surface of the supporting plate.

4. The method according to claim 3 further comprising the additional step of forming a photoconductive layer over the assembled smaller radiation detection panels.

5. The method according to claim 4 further comprising the step of forming an insulating layer under said photoconductive layer.

6. A method for tiling together a plurality of discrete submodules each having an upper and lower surface, an array of a plurality of transistors on said upper surface, and a seam edge face extending between the upper and lower surface, the method comprising:

a) beveling mating portions of each submodule seam edge face, thus creating on each said face a beveled portion adjacent the lower surface and an unbeveled portion adjacent the upper surface;

b) placing a sufficient amount of a filler material on at least one of said faces and pressing said faces together until the filler material extrudes above the upper surfaces but not down to the lower surfaces, producing joined submodules having a open gap between the beveled portions;

c) adhesively bonding a base plate across the lower surfaces of said joined submodules, said gap forming a degassing channel between said faces and said base plate.

7. The tiling method according to claim 6 further comprising between steps (b) and (c) the steps:

b1) inserting a cord in said gap;

b2) adhering a strip of film abridging said gap;

and wherein, after step (c), removing said cord.

8. The tiling method according to claim 7 wherein prior to pressing said faces together in step (b), includes placing a precision bead of said filler material on one unbeveled portion of one submodule.

9. The tiling method according to claim 8 wherein after placing the precision bead in step (b), placing the submodule that does not have the bead on a vacuum table and holding it down by vacuum prior to pressing said faces together.

10. The tiling method according to claim 8 wherein placing the precision bead of filler material in step (b) further comprises limiting the amount of filler to a quantity inadequate to completely fill the gap between the beveled portions during step (c).

11. The tiling method according to claim 6 wherein the beveling in step (a) is at an angle of about 10 degrees from vertical.

12. The tiling method according to claim 6 wherein the beveling in step (a) creates a beveled portion comprising approximately ¾ of the seam edge face.

13. The tiling method according to claim 6 further comprising coating each discrete array submodule with a protective microfilm prior to step (a) and removing said microfilm after step (c).

14. An imaging panel comprising:

a base plate having a top surface;

a plurality of discrete array submodules juxtaposed over the top surface of the base plate such that each submodule is disposed adjacent to at least one other submodule to form a two-dimensional mosaic of submodules having seams therebetween, each of said submodules including a dielectric substrate having a top surface and a bottom surface disposed adjacent the top surface of said base plate, and a plurality of transistors arrayed adjacent the top surface of said dielectric substrate, each of said seams being filled with filler material, a vented channel in the seam adjacent to the top surface of said base plate; and a base plate having a top surface;

a continuous imaging layer disposed over the plurality of array submodules.

15. The imaging panel according to claim 14 wherein the filler material extends in a ridge above the submodule top surface but not to the dielectric substrate bottom surface.

16. The imaging panel according to claim 15 wherein the imaging layer is a radiation detection layer.

17. The imaging panel according to claim 16 wherein the filler material extends over at least some of the transistors and wherein there is a gap between the transistors over which the filler material extends and the filler material.

18. The imaging panel according to claim 14 wherein the filler material is also an adhesive.

19. The imaging panel according to claim 14 wherein the vented channel is in the filler material in the seam.

* * * * *